United States Patent [19]

Chalmers et al.

[11] Patent Number: 5,272,446
[45] Date of Patent: Dec. 21, 1993

[54] DIGITALLY IMPLEMENTED FAST FREQUENCY ESTIMATOR/DEMODULATOR FOR LOW BIT RATE MARITIME AND MOBILE DATA COMMUNICATIONS WITHOUT THE USE OF AN ACQUISITION PREAMBLE

[75] Inventors: Harvey Chalmers, Rockville; Farhad B. Verahrami, Gaithersburg; Ajit Shenoy, Germantown, all of Md.

[73] Assignee: COMSAT, Washington, D.C.

[21] Appl. No.: 929,588

[22] Filed: Aug. 17, 1992

Related U.S. Application Data

[63] Continuation-in-part of Ser. No. 800,020, Nov. 29, 1991, abandoned.

[51] Int. Cl.⁵ .............................................. H04L 27/22
[52] U.S. Cl. .................................... 329/304; 329/310; 375/80; 375/83; 364/724.08; 364/726
[58] Field of Search ............... 329/300, 303, 304, 310, 329/341, 343; 375/80, 82, 83, 84, 85, 86, 87; 364/724.06, 724.08, 726

[56] References Cited

U.S. PATENT DOCUMENTS

| | | | |
|---|---|---|---|
| 3,758,870 | 9/1973 | Schmitt et al. | 329/310 |
| 4,245,325 | 1/1981 | Kikuchi et al. | 364/724.08 |
| 4,466,108 | 8/1984 | Rhodes | 375/83 |
| 4,912,422 | 3/1990 | Kobayashi et al. | 375/83 X |

*Primary Examiner*—Siegfried H. Grimm
*Attorney, Agent, or Firm*—Sughrue, Mion, Zinn, Macpeak & Seas

[57] ABSTRACT

A low-bit-rate, low-cost, all-digital preambleless demodulator for maritime and mobile data communications operates under severe high noise conditions, fast Doppler frequency shifts, large frequency offsets, and multipath fading. Sophisticated algorithms, including an FFT-based burst acquisition system, a cycle-slip resistant carrier phase tracker, an innovative Doppler tracker, and a fast acquisition symbol synchronizer, provide reliable burst reception. The compact DSP-based demodulator includes an input buffer receiving a complex sampled baseband input signal and providing a baseband output to a coarse frequency estimator fast Fourier transform (FFT) or discrete Fourier transform (DFT) module which produces a first estimation of the carrier frequency. A fine frequency estimator FFT or DFT module receives the first estimation and provides a second estimation of the carrier frequency. An extra coarse frequency estimator FFT or DFT module may be provided between the buffer and the coarse frequency estimator.

18 Claims, 11 Drawing Sheets

PREAMBLELESS PACKET FORMAT FOR THE STANDARD-C SIGNALLING CHANNEL

DOPPLER ESTIMATOR AND FREQUENCY TRACKER

DIGITALLY IMPLEMENTED FAST FREQUENCY ESTIMATOR/DEMODULATOR FOR LOW BIT RATE MARITIME AND MOBILE DATA COMMUNICATIONS WITHOUT THE USE OF AN ACQUISITION PREAMBLE

This is a continuation-in-part of application Ser. No. 07/800,020, filed Nov. 29, 1991 and now abandoned.

BACKGROUND OF THE INVENTION

The present invention relates to a digitally implemented demodulator for maritime and mobile data communications, and in particular to a fast frequency estimator which operates without using an acquisition preamble.

A typical packet format used for burst communications and signaling in a time division multiple access (TDMA) network employs a structure that includes an acquisition preamble at the start of the packet, followed by a known unique word (UW) pattern. The data portion of the packet then follows, with additional framing bits inserted periodically for long packets, with the packet ending in another known "end-of-packet" sequence.

The acquisition preamble that precedes the data portion of the packet typically incorporates an unmodulated carrier sequence for the carrier frequency and phase estimate at the receiver, followed by a clock recovery sequence for proper receiver clock phase alignment. The UW pattern is used for phase ambiguity resolution and burst time synchronization. After the preamble and UW segments have been received and acted upon, the receiver is ready to demodulate the ensuing data segment with the correct frequency, phase, and clock adjustments.

The unmodulated carrier segment appears as a single tone in the frequency spectrum for a short duration. The detection of the carrier can therefore be accomplished by frequency domain acquisition algorithms.

In an analog implementation, a frequency lock loop (FLL) may be used. A bank of analog bandpass filters followed by energy detectors may be used to give a coarse estimate of carrier frequency. A similar technique utilizes a bank of correlators tuned to several discrete carrier frequencies. In a digitally implemented receiver, a DFT/FFT-based algorithm may be used. Time domain techniques may also be used for the carrier frequency estimate, whereby the unmodulated carrier phase differences are computed periodically and an average estimate is obtained that is indicative of the rate of the phase change or the frequency offset.

The methods used for carrier frequency acquisition described above have limitations that preclude their use for communication networks that operate under hostile channel environments that include low signal-to-noise levels, large frequency offsets, Doppler frequency shifts, and multipath fading. The FLL technique, in particular, requires a finite "lock-in" time for the loop to acquire. The tracking range is also very limited if a high-resolution measurement is required. For data packets with very short acquisition preambles, or for preambleless packets, the FLL technique is disadvantageous. The FLL method may still be used during the data portion of the packet if the signal is squared to remove the modulation (for binary phase shift keying, or BPSK) but with a corresponding loss of operating signal-to-noise ratio that will compromise its operation for low channel signal-to-noise ratios.

The bandpass filter and correlator approaches become excessively complex if a very high resolution measurement is required. If the filters or correlators are of the analog type, they are also subject to drift and require precise components and frequent adjustments. In addition, signal detection is sensitive to the input signal level unless an automatic gain control (AGC) circuit is employed.

The straightforward FFT technique suffers the disadvantage of susceptibility to multipath that will affect the signal strengths in the frequency bins. A single DFT or FFT must also be very large (1024 points or greater) to operate successfully at very low values of $E_S/N_O$. A threshold to detect the signal presence will be unreliable unless external AGC is employed that will track the multipath fading. A tradeoff DFT/FFT computation time versus frequency resolution is also necessary. Fine frequency resolution translates to longer FFT computation time, and vice versa. In addition, this technique is suited for the case of a packet with an acquisition preamble. For preambleless packets, the straightforward FFT technique requires modifications.

The time domain frequency estimation technique is dependent on the unmodulated portion of the acquisition preamble, and is totally unsuited for preambleless packets. This method is also particularly sensitive to the magnitude of the frequency offset. If the frequency offset is large enough to cause a rotation of the signal vector through $2\pi$ radians between the periodic estimates, then the measurement will be in error. In addition, due to the low operating signal-to-noise ratios, a long time average of the phase difference measurements are required, thus necessitating a long acquisition preamble.

The required preamble that precedes the data portion of the packet often constitutes an excessive overhead that reduces the channel transmission efficiencies for short data packets. Particularly in the case of mobile and maritime communication networks that experience signal fades of varying degrees, the system design mandates the use of very short data bursts (approximately a few hundred bits) that are relatively immune to fades. These bursts generally are used for the channel request and assignment functions from the remote terminal to a central location, typically a network coordination center. With additional channel impairments such as Doppler shifts, low carrier-to-noise ratios, and frequency offsets, long acquisition preambles usually are required to locate the carrier correctly, and to acquire its frequency and phase. The use of a long preamble in this case is an extremely undesirable overhead that seriously undermines the channel transmission efficiencies for a large communication network, with potentially thousands of such remote terminals.

SUMMARY OF THE INVENTION

In view of the foregoing, it is an object of the present invention to provide a compact, low bit rate, low cost, all-digital burst demodulator that requires absolutely no acquisition preamble. Both the acquisition algorithms and the hardware architecture are applicable under a wide variety of system constraints, and are particularly well suited for reception of short data packets under very adverse channel conditions.

In accordance with the present invention, a digitally implemented fast frequency estimator has been devised for application in low bit rate maritime and mobile MPSK-modulated (M'ary phase shift keying) data communication that performs reliably under severe channel conditions, such as low signal-to-noise ratios, large frequency offsets and multipath fading. The estimator is well suited for carrier frequency estimation for short burst packets, particularly for those packets that do not have an acquisition preamble preceding the data portion, such as the preambleless packet used for the INMARSAT Standard-C signalling channel. The estimator detects signal presence independent of the input signal level, eliminating the need for automatic gain control. The estimation technique is particularly suited for implementation in a digital signal processor. The limitation on the operating bit rate is therefore solely a function of the processor speed.

In implementation, a two step process, using Discrete Fourier Transforms (DFT) or Fast Fourier Transforms (FFT), is used. The first step involves taking a time average of a sequence of hopping FFTs, with the sample window slid sequentially by half the window length for each such DFT/FFT computation. A time average of the signal energy in each of the DFT/FFT frequency "bins", followed by a relative energy level comparison between the bins, yields (a) a detection of the burst presence, and (b) the location of the carrier and its offset frequency from the reference frequency. The coarse carrier frequency is resolved to ±75 Hz in the first step. The second step involves performing another DFT/FFT around the frequency range identified by the first step to yield a fine frequency estimate resolved to less than 10 Hz.

The present invention embodies several improvements and enhancements over the old methods described above. A summary of the advantages is as follows:

1. The estimator operates on MPSK modulated data directly, eliminating the requirement of a carrier acquisition preamble sequence;
2. The use of separate coarse and fine estimators allows carrier acquisition over a very wide frequency range (greater than the MPSK symbol rate) at very high resolution (<1% of the symbol rate). This resolution accuracy, under conditions of large frequency offsets, low signal-to-noise ratios and multipath fading, is a major improvement in the DFT/FFT-based method. In one embodiment of the invention, an additional estimator stage is added, yielding a multi-stage approach which enables yet further improvement;
3. Time averaging of the measured signal strengths in each of the DFT/FFT frequency bins increases the signal-to-noise ratio of the measurement, making its operation possible even at very low channel signal-to-noise values;
4. The use of "time-hopped" DFT/FFTs with the sample window moved by half the window width for each DFT/FFT computation provides the advantage of minimizing the variance of the estimation while drastically reducing the number of computations as compared to DFT/FFTs slid in time by 1 sample period;
5. Relative energy level comparison between DFT/FFT bins removes the effect of signal strength variations due to multipath fading and input gain variations. Signal activity is detected independent of the input signal level. As a result, there is no need for an AGC as otherwise typically would be employed. The result of performing operations (3), (4), and (5) yields not only the detection of the burst presence, but also locates the carrier and determines its offset frequency from the reference frequency;
6. The use of sample rate decimation between stages greatly reduces the computational complexity compared to other FFT based approaches. Actual implementation of this algorithm has been optimized for digital signal processor-based (DSP) demodulators. Thus, with the DSP assembly language code already developed, an increase in the operating bit rate is readily achieved by migrating the code to faster processor versions in the same DSP family or to another faster processor of a different family.

The use of the second DFT/FFT for the fine frequency estimation and the application of this technique for the coarse and fine frequency estimations for preambleless data packets are particularly important features of the inventive method. The use of multiple DFT/FFT stages for carrier frequency estimation, in which the output of each preceding stage is fed to the next stage, greatly increases the frequency resolution at each stage.

U.S. Pat. No. 4,466,108, commonly assigned with the present application, discloses a technique for performing phase shift keying (PSK) synchronization without requiring a preamble. However, the technique disclosed therein does not use the multiple-stage DFT/FFT approach of the present invention, inter alia, as will be discussed herein.

Other known techniques, such as that disclosed in U.S. Pat. No. 4,245,325, use an FFT technique, but for a very different purpose from that of the invention. U.S. Pat. No. 4,912,422 uses multiple FFT stages, but uses the resulting frequency estimate to steer a separate set of bandpass filters, whereas in the present invention FFT and filtering processes are combined in a single operation.

Other patents considered to be possibly relevant background to the present invention include U.S. Pat. Nos. 4,528,567; 4,618,830; 4,654,667; 4,689,806; 4,827,488; 4,870,420; and 4,885,756.

Two embodiments of the software algorithms to be implemented in the hardware embodiments of the invention are described herein. The second embodiment has greater flexibility than the first in terms of operability at different symbol rates. In particular, the second embodiment provides yet another, extra coarse resolution DFT/FFT stage, yielding a total of three DFT/FFT stages. The addition of the "extra coarse" stage estimates the frequency of the modulated spectrum. The input signal is not preprocessed by a squaring operation, as has been done traditionally to remove the modulation first. As a result, performance at low S/N ratios is improved greatly, since squaring can degrade the S/N ratio by more than 6 dB. The first, "extra coarse" stage acts to filter the input signal to remove a significant amount of noise. Squaring then is employed in the second stage, where the impact of the degradation is not as great.

BRIEF DESCRIPTION OF THE DRAWINGS

The foregoing and other features and advantages of the invention will be understood from the following detailed description taken in conjunction with the accompanying drawings, in which.

DETAILED DESCRIPTION OF THE PREFERRED EMBODIMENTS

Figure 1:
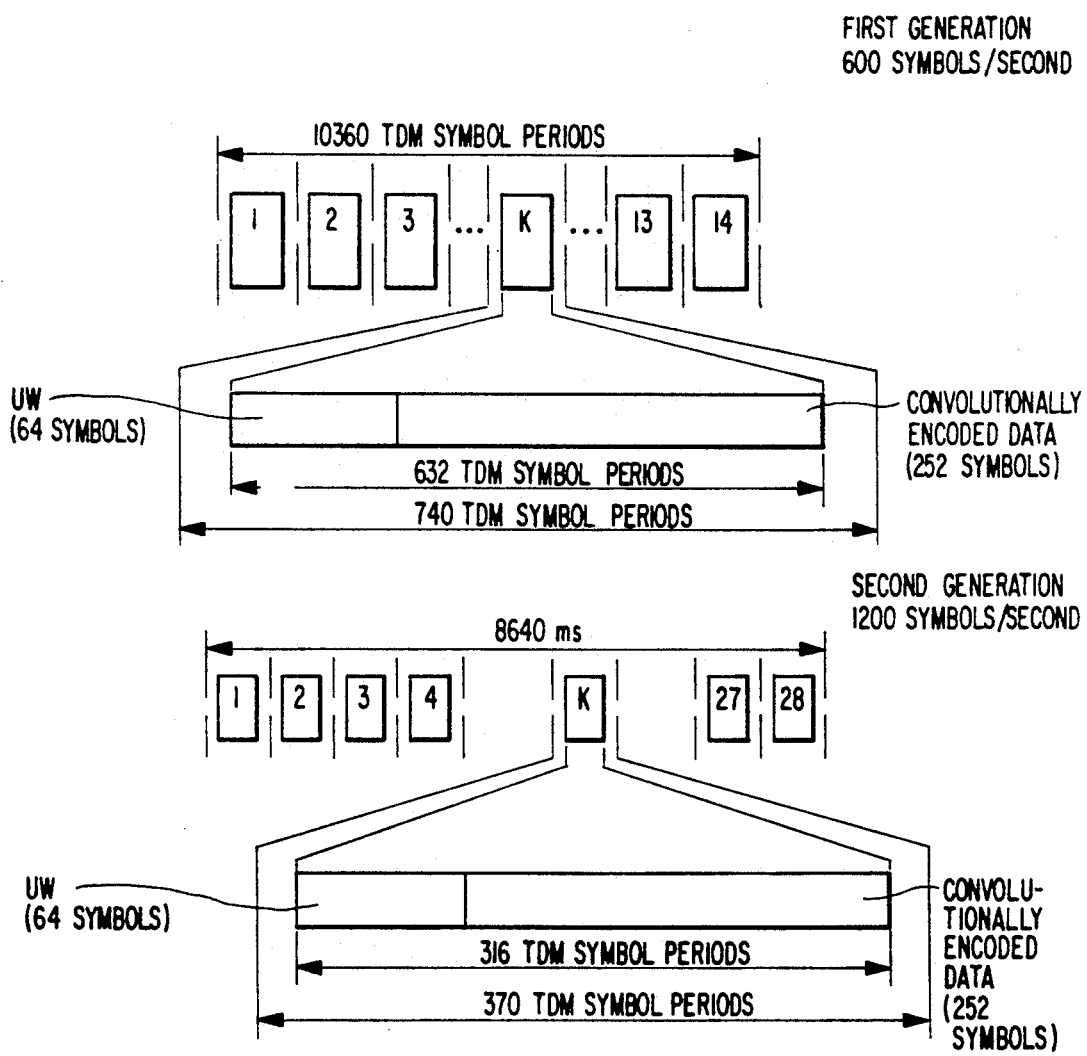
FIG. 1 shows a preambleless packet format for the Inmarsat-C signaling channel, at two different symbol rates.

In order to illustrate the inventive frequency acquisition algorithms and their hardware implementation, the preambleless short data packet format from a new maritime communication network, designated as "Standard-C" or "Inmarsat-C", which has already been specified by the International Maritime Satellite Organization, (INMARSAT), will be used. The preambleless short data packet format is used for the slotted ALOHA random access signalling requests from the remote ship terminals. The proposed frame format for this signalling packet is shown in FIG. 1. This particular frame format and the Inmarsat-C channel parameters have been used as a representative mobile environment to design and demonstrate the efficacy of the preambleless frequency acquisition algorithms that were developed.

The selected representative preambleless data packet has the following characteristics, as obtained from the Inmarsat-C System Definition Manual, for the second generation format shown in FIG. 1 (having a rate of 1200 symbols/sec): No acquisition preamble of any sort; the TDMA data packet starts with a 64 bit unique word; and the data segment is 252 rate-$\frac{1}{2}$ convolutionally encoded bits, to yield a packet size of 316 bits (632 for the 600 symbol/sec case). The timeslot width is 370 symbol periods (740 for the 600 symbol/sec case). The severe channel operating constraints include BPSK modulation at the low rate of 600 and 1200 symbols/sec; a carrier frequency uncertainty of ±1450 Hz; a short term Doppler rate of 65 Hz/sec with a maximum range of ±50 Hz; an operating $E_s/N_o$ of 4.7 dB at the demodulator input; slot timing uncertainty of ±27 symbols; and finally, a carrier-to-multipath ratio of 7 dB with a Rician fading bandwidth of 0.7 Hz. As will be seen below, testing of the invention was carried out in accordance with these parameters.

These constraints impose very challenging processing requirements for the preambleless demodulator in order to successfully receive and detect each preambleless packet under the worst possible channel environment and slot timing uncertainties. As now will be described, sophisticated acquisition algorithms that function in this hostile channel environment have been developed and implemented successfully in DSP-based hardware. Test data obtained with the hardware implementation and a specialized test fixture indicate excellent correspondence with the expected acquisition performance, as predicted by high-level computer simulation as well as theory. These results will be summarized below.

In the following, it is assumed that an MPSK modulated signal has undergone IF conversion to baseband, and that both the in-phase and quadrature (I and Q) components are available to the digitally-implemented demodulator. The baseband received signal will contain a main spectral lobe within the frequency range $\pm R_s$, where $R_s$ is the symbol rate. Given a large frequency uncertainty, $\pm f_c$, in the received carrier due to Doppler shifts and downconverter/upconverter translation errors, the total receiver one-sided bandwidth must be greater than $(R_s + f_c)$. This represents a lower bound on the receiver input filter bandwidth. In general, however, the channel spacing determines the filter bandwidth. The receiver I and Q channel filters must exhibit a very sharp rolloff in order to minimize adjacent channel interference. The frequency acquisition technique described herein assumes the presence of such channel filters to limit the out-of-band noise and adjacent channel interference. Since the I and Q analog-to-digital (A/D) converter modules preceding the digital demodulator require anti-aliasing filters, this is not a problem. The channel filters also serve as anti-aliasing filters.

The first step in the frequency acquisition method consists of computing a series of time-hopped windowed DFT/FFTs (called "periodograms"), and averaging the energy magnitudes over the duration of a burst to reduce noise and fading effects. Given a sequence of samples, x(n), it is possible to form K subsequences $x_r(n)$, $r = 1, 2, \ldots, K$, of length L spaced L/2 samples apart. For each sub-sequence, the windowed DFT/FFT $X_r(m)$ is given by the following equation:

$$X_r(m) = \sum_{n=0}^{L-1} x_r(n) w(n) e^{-j(2\pi/L)nm}$$

where w(n) is the window function.

The periodogram $I_r(f_m)$ is equal to the squared magnitude of an DFT/FFT bin:

$$I_r(f_m) = |X_r(m)|^2$$

where $$f_m = \frac{m}{L} = FFT \text{ frequency}$$

The unnormalized power spectral density is then:

$$S_x(f_m) = \sum_{r=1}^{K} I_r(f_m)$$

The effect of the modulation is first removed by squaring the complex inputs (for BPSK modulation). This concentrates most of the signal energy at a single frequency equal to twice the modulated carrier frequency. Although the squaring of the signal results in a loss in the operating signal-to-noise ratio, this loss is regained due to the averaging process performed on the signal strength estimates. Only the 256 symbols (2048 samples) in the middle of a timeslot assumed to contain the carrier are processed. The remaining symbols at the beginning and end of the timeslot are discarded due to burst location uncertainty. At a sampling frequency of $f_s = 9600$ samples/sec, a 64 point DFT/FFT provides a resolution of 150 Hz. The resolution is increased to 75 Hz since the estimate of the squared data must be divided by two.

The 2048 data samples are divided into 64 blocks of 64 samples each ($K = L = 64$), with each block overlapping adjacent blocks by 32 samples. Each block is multiplied by a 64 point Blackman window. A Blackman window has a very broad transition width so that a carrier located at the very edge of an DFT/FFT frequency bin will be attenuated only 1.1 dB, as compared to 3.9 dB for a rectangular window. The carrier frequency is determined by choosing the bin containing the maximum power spectrum. Because the range of the frequency search is limited to ±1450 Hz, the DFT/FFT algorithm can be reduced to only 40 DFT/FFT outputs. The entire calculation is very efficient when written in in-line code in a DSP chip because the small DFT/FFT size allows exclusive use of the chip's internal data RAM. The total number of processor instruction cycles is approximately 175,000.

The frequency estimator will locate a peak regardless of the presence of a carrier. Burst presence can be detected by computing the peak/average energy ratio. The peak energy is simply the energy of the periodogram containing the maximum energy. The average energy is the average of the other 39 periodograms. If the ratio is greater than a predetermined threshold, then a burst has been detected. This method is very reliable over a wide dynamic range, eliminating the need for gain control. Simulations indicate that a threshold near 2.0 produces good results down to $E_s/N_o = 2$ dB.

The accuracy of the estimate is increased to within several Hz (depending on the amount of Doppler shift across a burst) using the fine frequency estimator. The 40 complex outputs of all 64 DFT/FFTs are stored in memory. The 64 values corresponding to the DFT/FFT bin containing the carrier can be viewed as a decimated time series of the original input, with a decimation factor of 64. If the carrier is located in bin M, the time series $X_r(M)$ is a bandpass filtered version of $x_r(n)$ filtered around the carrier frequency by the windowed Fourier coefficients. Thus, if the series is processed by another L-point DFT/FFT and the bin with the maximum squared magnitude is selected, the resolution of the estimate can be increased by a factor of L. For the representative case of $L = 64$, the fine frequency estimator resolution is 1.2 Hz, assuming no carrier frequency drift over the measurement interval. For mobile satellite applications, the actual resolution is limited by short-term Doppler effects and is on the order of 5–10 Hz.

Demodulation of the stored complex samples by the estimated frequency can be performed by multiplying the samples by $[\cos(2\pi f n T) + j\sin(2\pi f n T)]$. The sine and cosine values are obtained from a look-up table. Precautions need to be taken in minimizing the truncation error while calculating the argument $2\pi f n T$.

Figure 2:
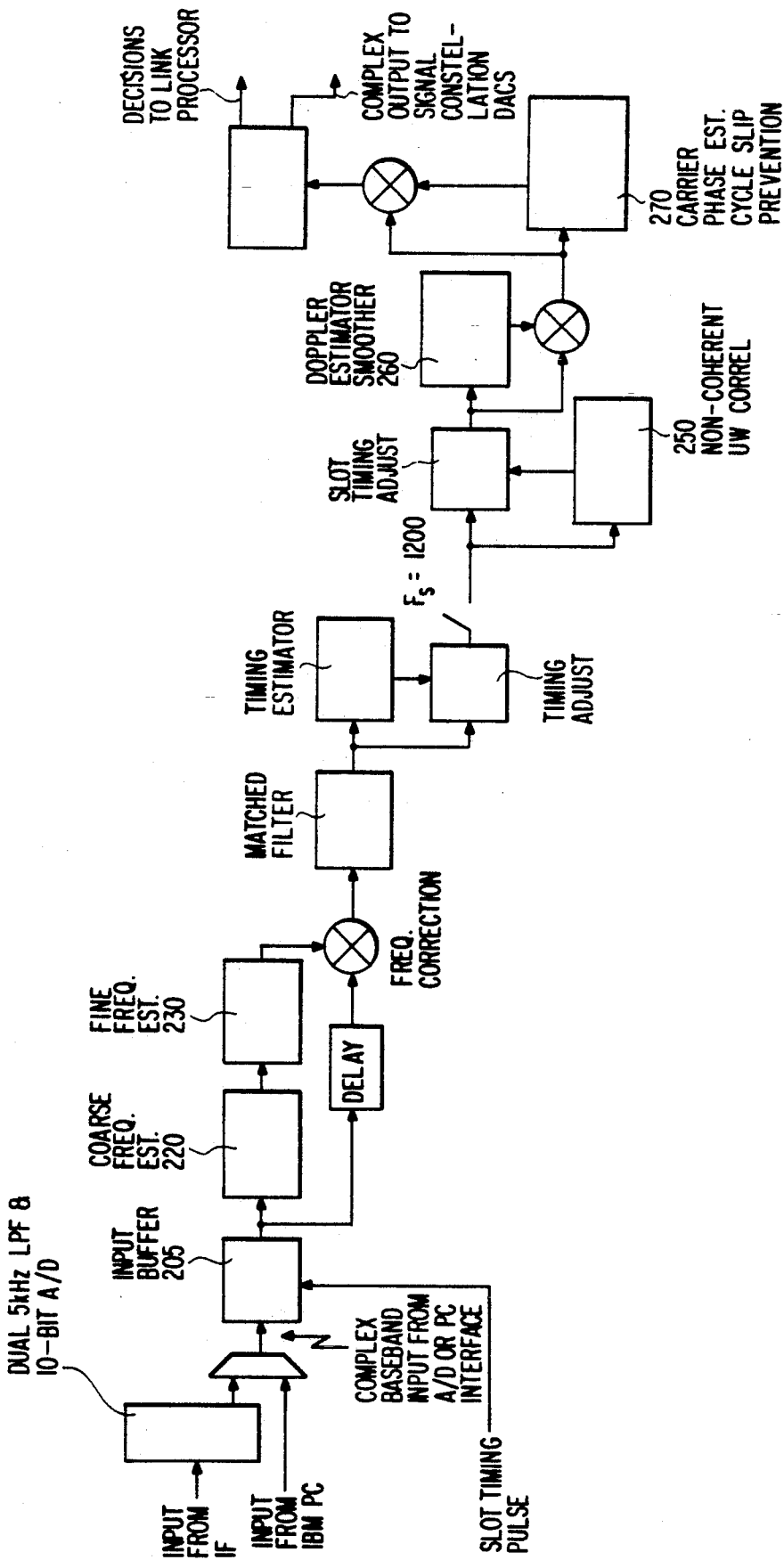
FIG. 2 is a functional block diagram in accordance with a first embodiment of the present invention.

Looking now at a hardware implementation of the invention, as seen in FIG. 2, the DSP-based demodulator accepts a complex sampled baseband input either from a pair of A/D converters connected to the IF downconverter unit, or from a personal computer capable of generating simulated real-time channel packet data for test purposes.

An input buffer 205 stores complex input samples for an entire burst duration before processing begins, thus allowing the burst to be reprocessed during several passes to recover the final data. The buffer is controlled by an external slot timing pulse which marks the beginning of a burst timeslot. The actual burst location can be anywhere within the first 54 symbols allowed for guard time. The Inmarsat-C slotted ALOHA protocol presents several difficult problems for burst acquisition, as was outlined above. The usage of each burst timeslot in the signaling channel is random, and a given timeslot may be empty or may contain a collision from two or more remote transmitters.

The first step in burst acquisition is estimation of the carrier frequency offset. The frequency acquisition algorithm is the most critical to successful demodulator performance since it must also detect signal presence at a very low signal to noise (S/N) ratio (1.5 dB for an $E_s/N_o$ of 4.7 dB) because of the large extra input bandwidth required to allow for frequency uncertainty. A simple energy detector is ineffective for burst presence detection since the signal and noise energies are nearly equal. Frequency acquisition is performed in two steps. Coarse acquisition in coarse frequency estimator 220 estimates the carrier frequency to within 75 Hz, and fine acquisition in fine frequency estimator 230 narrows the uncertainty down to 10 Hz. The data in the input buffer 205 is corrected for frequency offset using a complex multiplication by the sine and cosine of the carrier frequency generated from look-up tables.

Symbol timing adjustments are performed digitally in software. A conventional A/D sample clock adjustment circuit cannot be used, as an entire burst is sampled before symbol timing is acquired. The frequency-corrected samples are first match filtered. Symbol timing then is acquired, and the match filter output delay line is shifted to the proper timing phase and decimated to the symbol rate of 1200 symbols/sec.

After symbol timing comes the removal of the burst time uncertainty, correction for the Doppler shift, and detection of the phase-coherent data. The burst location is acquired with a non-coherent unique word (UW) correlator 250. Coherent correlation is not possible because at the maximum Doppler rate of 65 Hz/sec, the carrier phase will drift significantly over the duration of the UW. The UW correlator 250 serves a second function in addition to slot timing acquisition. If the magnitude of the correlation exceeds a predetermined threshold, then a valid packet has been received. Otherwise a packet collision is declared and the data is ignored.

Coherent data detection is not possible unless the Doppler shift is removed. The Doppler estimator/smoother 260 calculates a frequency offset for each symbol and correction is accomplished with a complex multiplication stage. The Doppler-corrected symbols will have arbitrary carrier phase, and the phase estimator 270 measures the phase offset and adjusts each symbol to the zero degree phase reference. The estimator 270 is able to detect approaching cycle slips and compensate for them before they occur. A coherent UW correlation is performed on the output of the phase detector to correct for the inherent 180 degree phase ambiguity of BPSK modulation. The final data, along with status information, is sent to the host processor, where Viterbi decoding, data formatting, and cyclic redundancy check (CRC) are performed. Further details of the major demodulator algorithms are provided below.

With respect to frequency acquisition, the requirement of detecting signal presence/packet collisions as well as accurately measuring the carrier frequency of a BPSK-modulated signal at an input S/N near 0 dB is especially severe. The inventive DFT/FFT-based spectral estimation technique was found to be very robust and readily suited for DSP implementation. As mentioned above, the method consists of computing a series of time-hopped windowed DFT/FFTs and averaging the energy magnitudes over the duration of a burst to reduce noise and fading effects. The DFT/FFT bin with the maximum average energy is presumed to contain the carrier. A burst detection algorithm, to be described below, detects the presence of the burst from the energies in the DFT/FFT bins. Further processing using a similar DFT/FFT technique increases the frequency resolution to well within the Doppler tracker range. The method is very reliable over a wide dynamic range. An optimal threshold has been obtained through simulation, as will be described, yielding excellent results.

As for matched filtering, the lack of any kind of pulse shaping at the transmit side results in a simple integrate and dump matched filter structure at the receive side. Since the symbol timing has not yet been determined, demodulated samples are processed through this filter with the outputs computed at the sample rate. Once the symbol timing has been established, the filter output is decimated to the symbol rate.

Symbol synchronization is achieved by first calculating a timing error vector W between the signal envelope and two suitable selected quadrature symbol timing references, P(n) and Q(n). The error vector, $W = U + jV$, is then used to estimate the timing phase difference by calculating arctan (V/U). The real and imaginary components of the timing error vector, U and V, are obtained from correlating the envelope of the matched filter output with the two timing references. After the symbol timing has been calculated, it is rounded to the nearest timing phase step, and the proper output of the matched filter is selected.

The symbol rate stability of the transmitter is given as $\pm 1$ part per $10^5$. Therefore, under worst case conditions, the symbol rate could change by $10^{-3}$ degrees during one signaling packet interval. This is negligible; hence, a single symbol timing estimate is sufficient for each packet.

UW correlation is performed after symbol timing has been established, but before removal of Doppler frequency offset and carrier phase recovery. The 64 data symbols to be correlated with the UW pattern are divided down into several subgroups. The correlation results of these subgroups with the proper part of the UW sequence are then added and used to determine the location of the UW sequence in the packet.

Figure 3:
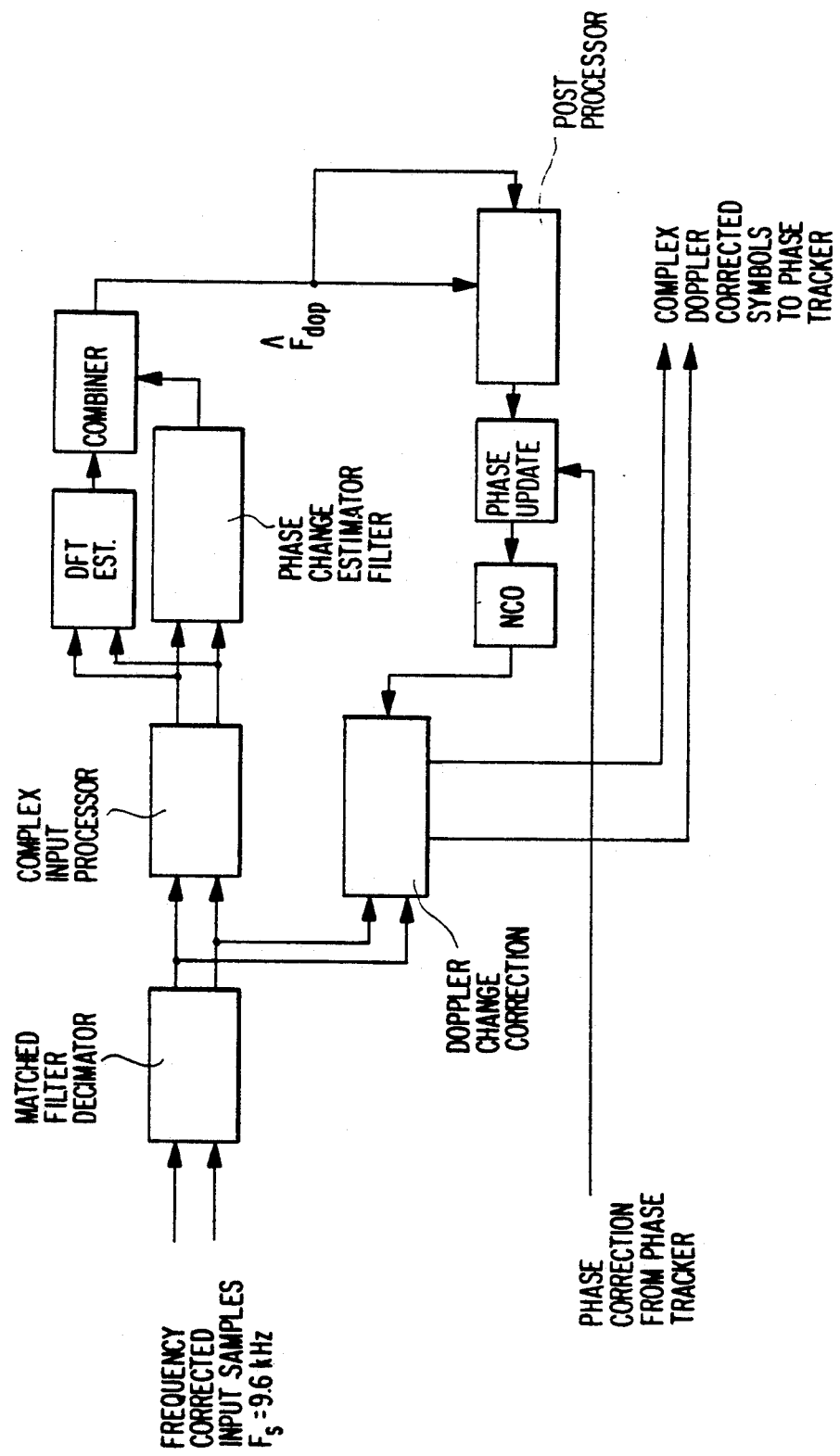
FIG. 3 is a block diagram of the Doppler estimator and frequency tracker of FIG. 2.

The Doppler tracker (FIG. 3) must reduce the carrier frequency error to less than 2 Hz to prevent a complete phase reversal in 316 symbols. The tracker removes any residual frequency error from the frequency acquisition stage as well as removing the Doppler. The tracker is essentially open-loop, to prevent error propagation caused by impulse noise. Because the Doppler rate is well behaved, only a small number of estimates are computed using contiguous N-symbol blocks. N is sufficiently large to reduce the variance of the estimate to much less than 1 Hz. Although the Doppler may drift significantly between two estimates, it is assumed that the Doppler shifts undergo sinusoidal changes. Therefore, the Doppler frequency associated with each symbol can be computed by an appropriate smoothing function between two estimates.

Two separate estimators are employed for increased accuracy. The complex symbols output from the input processing block are applied to both estimators. The first, coarse estimator 220 employs a discrete Fourier transform (DFT)-based technique to estimate the Doppler frequency. A second, fine estimator 230 is employed to substantially increase resolution. The estimates are sent to the post-processor block, and a new Doppler phase angle is calculated for each symbol. The phase updates drive a numerically controlled oscillator which is used for the Doppler correction of the matched filtered symbols.

Figure 4:
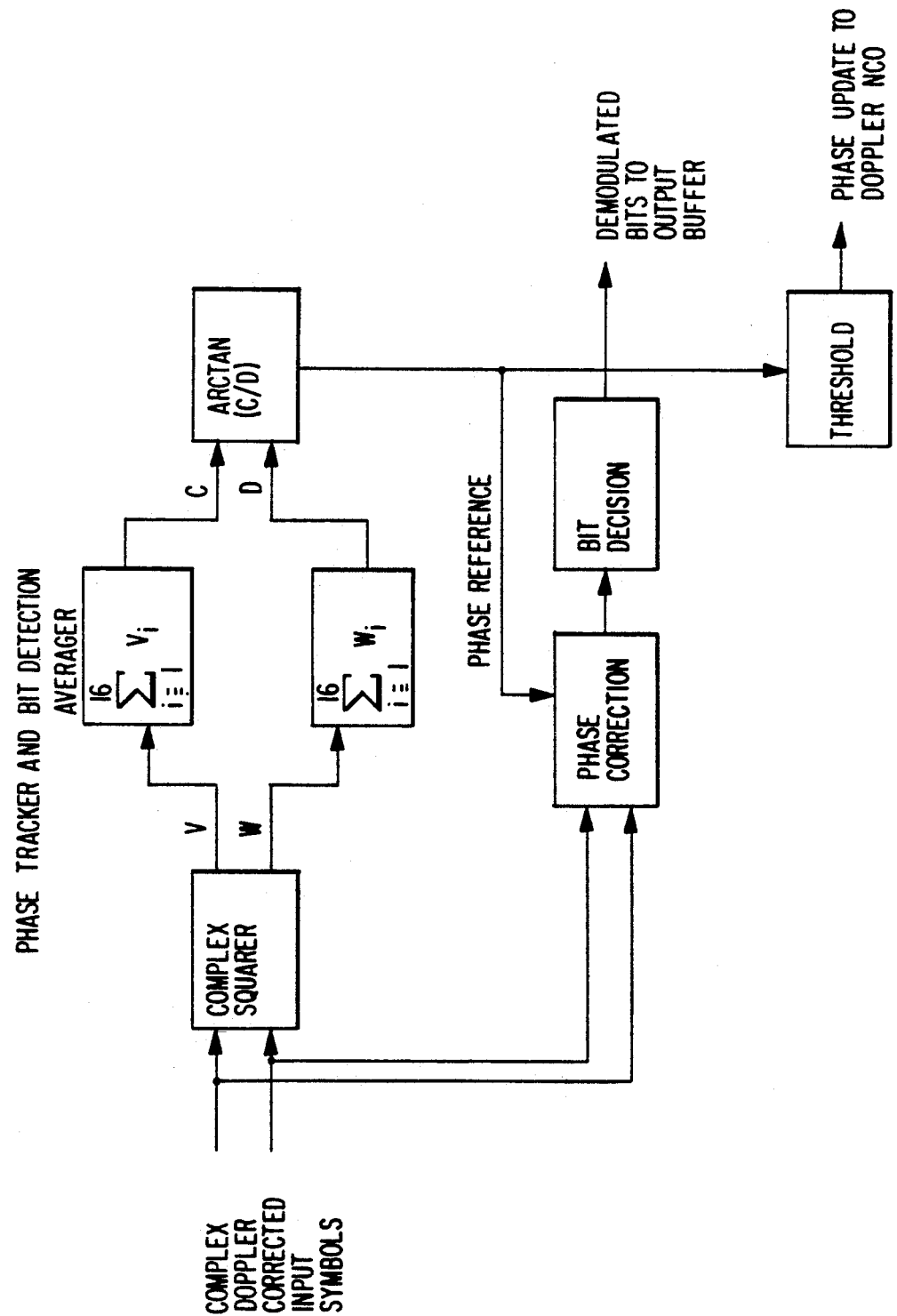
FIG. 4 is a block diagram of a phase tracker and bit detector used in connection with the Doppler estimator and frequency tracker of FIG. 3.

The Doppler post-processor ensures that the Doppler corrections do not suffer from appreciable phase jitter. The phase tracker (FIG. 4) adjusts the Doppler-corrected symbols to the zero-degree phase reference in order to perform bit detection. A very simple algorithm is employed that is essentially open-loop, again providing very fast recovery from noise bursts. The complex symbols are squared to remove modulation effects, and then the real and imaginary components are averaged over a block of $\pm M$ symbols to give an average two-dimensional carrier phase coordinate. The carrier phase can be derived by making an arctangent calculation using a power series approximation. The input symbols are then rotated by an NCO so that one of the two BPSK modulated symbols falls at zero degrees. A 0/1 bit decision is made based on the sign of the real component of the rotated symbols.

The carrier phase normally rotates quite slowly, but occasional corrections must be fed back to the Doppler tracker to maintain a phase less than 180 degrees, or else cycle slips would occur. These corrections ensure that the first symbol of the next block will have a phase offset near zero degrees. The final bit decision is passed to the host processor for subsequent Viterbi decoding.

Figure 5:
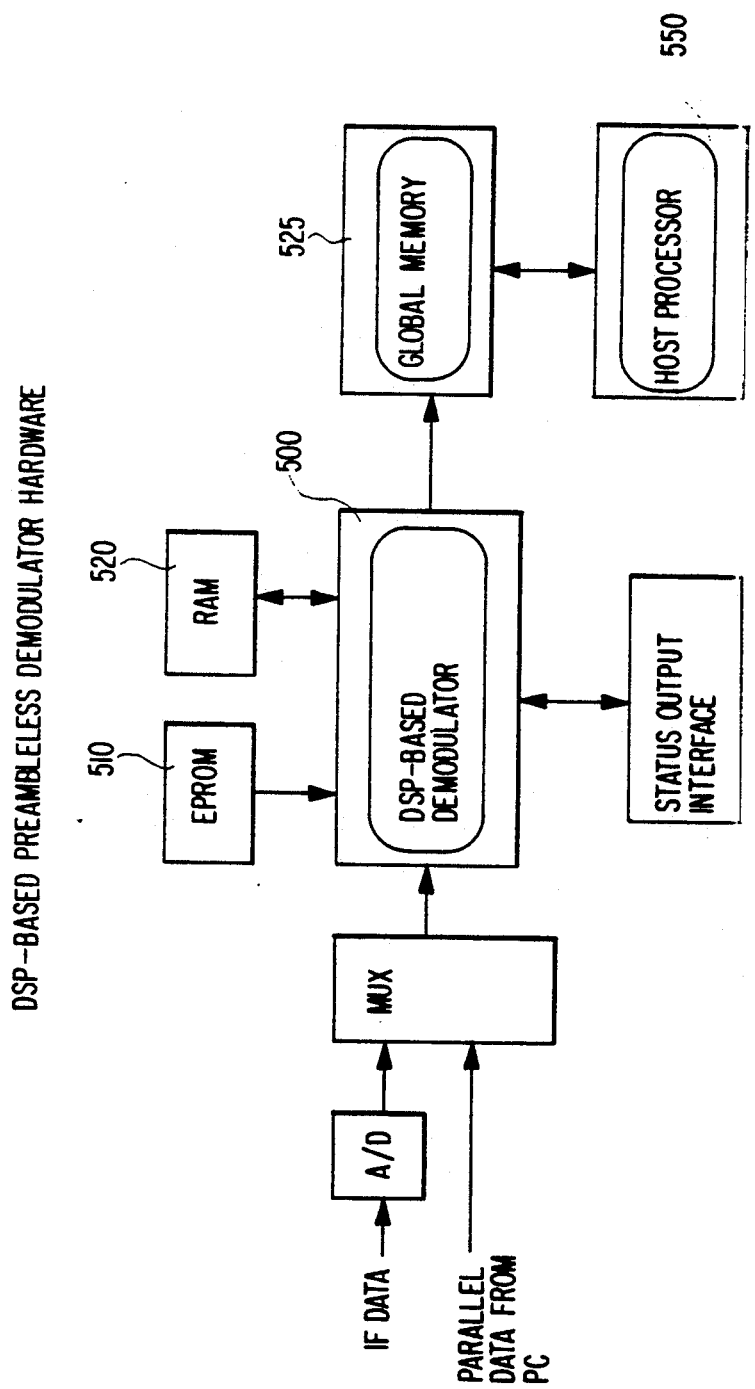
FIG. 5 is a structural hardware block diagram of a first embodiment of the present invention.

FIG. 5 is a high-level block diagram of the DSP-based demodulator hardware. The demodulator operates on baseband received digitized inputs obtained from the output of the IF down-converter or a personal computer test interface. High speed erasable programmable read-only memory (EPROM) program memory 510 and random access memory (RAM) data memory 520 are used so that the external memory is addressed without wait states. Extensive use of programmable logic devices yields a compact design for the DSP peripheral logic, such as the address decoders, memory control signals, port decoders, and I/O interfacing. Such implementation is well known to those of working skill in this technological field, so further detailed description of this aspect of the invention is not believed necessary.

Communication between the demodulator 500 and the host processor 550 takes place through a high-speed global RAM 525 connected to each processor bus. Output ports for data and other status monitoring and control signals are provided.

Figure 6:
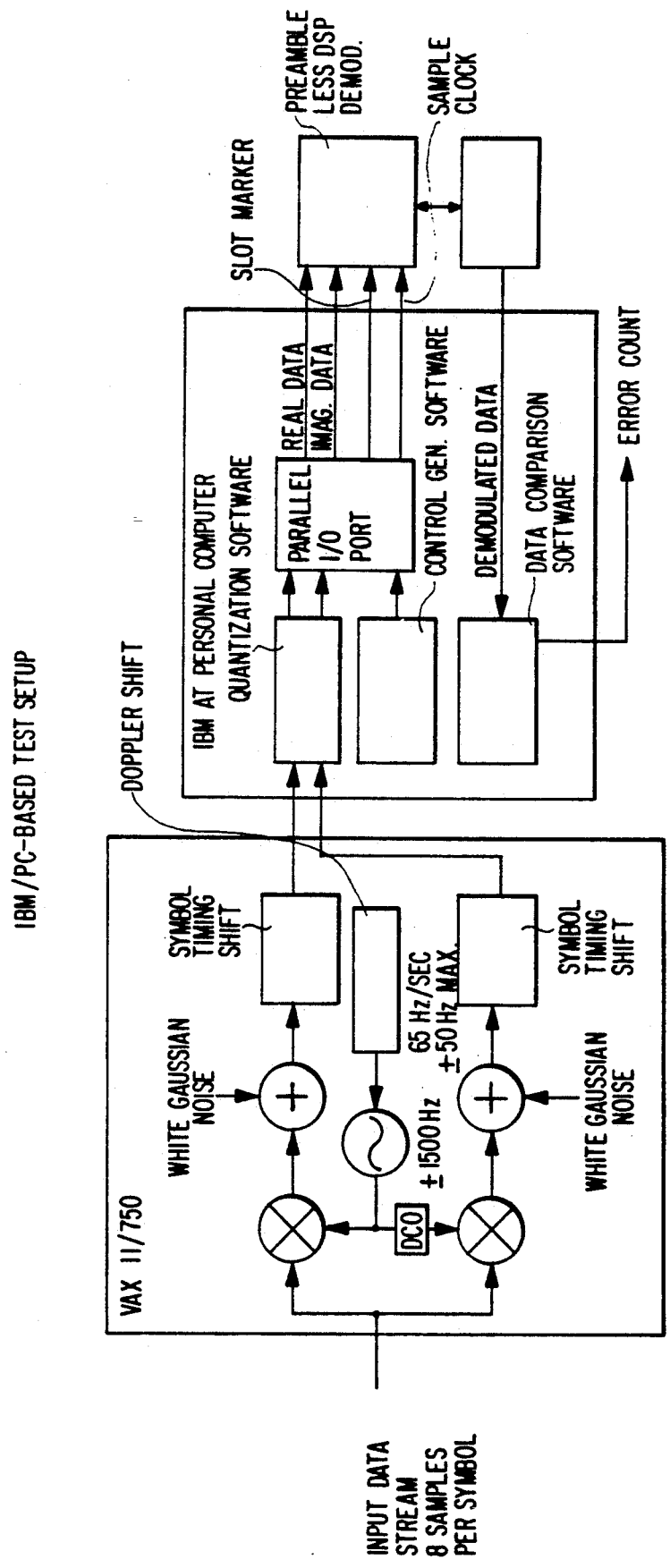
FIG. 6 is a block diagram of a test setup used to test the algorithms used in the preambleless demodulator according to the present invention.

To test the inventive demodulator, a special personal computer-based test setup has been designed using the simulated test data with channel impairments. As shown in FIG. 6, the test files, generated on a larger, minicomputer or mainframe computer (a VAX-11/750 is identified in FIG. 6), were downloaded to a personal computer. User selectable frequency offsets, Doppler shifts, noise levels, delays, and symbol timing offsets within the slot could be entered on the larger computer during file creation. Test program modules were written on the personal computer to format the data file and download the sampled values to the demodulator board via a parallel port interface. Demodulated data then was uploaded from the DSP emulator to the personal computer through a serial port, where another program compared it with the transmitted packet and reported the error statistics.

The preambleless signaling demodulator was tested at a symbol rate of 1200 bit/sec for frequency offsets ranging between $\pm 1450$ Hz, sinusoidal Doppler shifts of 65 Hz/sec with a range of $\pm 50$ Hz, $E_s/N_o$ values from 2 to 6 dB and the reference noiseless case, symbol timing offsets between $\pm 180$ degrees in 45 degree steps, and slot timing uncertainty in the range of $\pm 27$ symbols. With no noise, the inventive demodulator recovered the data successfully, with no errors, under all of the above conditions. At the specified operating $E_s/N_o$ of 4.7 dB, an average of 2.7 raw errors per packet (316 symbols) were detected. This result compares well with the limiting theoretical value of 2.4 errors per packet, representing performance within 0.2 dB of the theoretical bit error rate (BER) curve. The error statistics indicate that no packet errors will be experienced after Viterbi decoding (to be performed by the host processor). Representative test results are provided in Table 1.

be seen that the invention also has wider ranging applications.

With future enhancements to DSP technology and repackaging for medium and high-volume production, the entire preambleless demodulator can be produced easily in a very compact package at even higher symbol rates. Software changes also can be introduced to extend the operating bit rate, change the modulation format, or customize the operating parameters for the Doppler multipath fading according to the desired channel conditions. This technology also lends itself to other low bit rate systems, where the existing preambles may now be shortened or discarded altogether, if the digital implementation approach described herein is adopted.

The frequency acquisition algorithm just described for the Inmarsat-C CES signalling and message channel demodulators was optimized for operation at 1200 bit/sec, representing the second generation of service. With the first generation service introduction at 600 bit/sec, the inventors investigated whether the inventive technique would still function reliably at the lower rate. It was found that in the 600 bit/sec mode the current algorithm would still work reliably at an $E_s/N_o$ of 4.7 dB, but with a margin of less than 1 dB. Therefore, in order to operate reliably at 600 bit/sec in presence of multipath fading, an enhancement to the current frequency estimation algorithm was considered to be desirable.

In view of the foregoing, in accordance with another embodiment of the present invention, another enhanced frequency acquisition algorithm that addresses this issue is discussed herein. The reliable operation of the new algorithm for the first generation, at an $E_s/N_o$ of 0 dB has been validated. This technique can also be applied to the second generation service at 1200 bit/sec for improved acquisition performance.

TABLE 1

Representative Measured Test Results for the Preambleless Demodulator

| $E_s/N_o$ dB | Input Parameters | | | | Measured Values | | | Errors per packet (in symbols) |
|---|---|---|---|---|---|---|---|---|
| | $f_S$ (Hz) | Doppler on/off | $\Delta T$ (deg.) | Slot Delay sym | $f_S$ (Hz) | $\Delta T$ (deg.) | Slot Delay sym | |
| No Noise | 0 | off | 0 | 4 | 0 | 0 | 4 | None |
| No Noise | +1450 | off | +180 | 3 | +1450.75 | +180 | 3 | None |
| No Noise | −1450 | off | +180 | 3 | −1450.81 | +180 | 3 | None |
| No Noise | +1450 | on | +180 | 3 | +1460.13 | +180 | 3 | None |
| No Noise | −1450 | on | +180 | 3 | −1439.06 | +180 | 3 | None |
| 4.7 | 0 | on | +180 | 3 | +9.38 | +180 | 3 | 4 |
| 4.7 | +1450 | on | +45 | 3 | +1460.13 | +45 | 3 | 2 |
| 4.7 | −1450 | on | −45 | 3 | +1441.44 | −45 | 3 | 1 |
| 4.7 | +953 | on | −180 | 4 | +963.25 | +180 | 4 | 3 |
| 4.7 | +1450 | on | 0 | 53 | +1460.13 | 0 | 53 | 4 |
| 3.0 | −1450 | on | −180 | 3 | −1439.06 | −180 | 3 | 9 |
| 2.0 | +725 | on | 0 | 53 | +733.56 | 0 | 53 | 12 |

As has been described, in accordance with the present invention, a compact, low cost, low complexity DSP-based preambleless demodulator employs powerful digital signal processing techniques to detect and acquire the carrier frequency offset and symbol timing under high noise conditions, as well as to track Doppler and short term variations in signal amplitude because of multipath fading. As a result, it is possible to acquire and demodulate the short burst packets without any acquisition preamble. It is noted that, while the invention has been described with reference to mobile and maritime satellite and terrestrial communication networks that use very short burst packets for access request and response channels (an application for the maritime Inmarsat-C system having been described in detail), it can The Inmarsat-C CES signalling and message demodulators operate on baseband complex samples. With BPSK modulation and no pulse shaping present on the link, the one-sided bandwidth of the input signal spectrum is equal to $R_s$, the symbol rate. However, due to the large carrier frequency offset present in the Inmarsat-C signalling and message channels ($\pm 1500$ Hz), a relatively wide bandwidth anti-aliasing filter is required at the inputs to the demodulators. For the 1200 bit/sec mode of operation ($C/N_o = 35.5$ dB-Hz), the required one-sided filter bandwidth is 2700 Hz, while for the 600 bit/sec mode ($C/N_o = 32.5$ dB-Hz) this bandwidth can only be reduced to 2100 Hz. The carrier-to-noise power is given by:

$$\frac{C}{N} = \frac{E_S}{N_O} \frac{R_S}{B}$$

where B is the one-sided filter bandwidth. With the operating $E_S/N_o=4.7$ dB for both modes and the filter bandwidths as above, the carrier-to-noise power ratios at the demodulator input are 1.2 dB for $R_s=1200$ bit/sec, and $-0.7$ dB for $R_s=600$ bit/sec. Therefore, a loss of approximately 2 dB in the acquisition performance of the 600 bit/sec mode compared to the 1200 bit/sec mode is expected.

The frequency acquisition algorithm in accordance with the first embodiment of the invention, as has been described, consists of two Discrete Fourier Transform (DFT) stages. The first stage (i.e., the coarse frequency estimator) consists of 64-point hopping Fast Fourier Transforms (FFT) which operate on the squared input samples. As the carrier to noise ratio (C/N) is reduced below 0 dB, the squaring loss increases exponentially. This loss, combined with the 2 dB drop in the input C/N due to the wider filter bandwidth, would limit the performance of the frequency acquisition algorithm in the 600 bit/sec mode. Accordingly, in accordance with the second embodiment of the invention, another frequency acquisition algorithm has been devised in order to improve the demodulator performance at 600 bit/sec. This embodiment now will be described.

The second embodiment also uses the DFT/FFT concept, as in the first embodiment. In order to reduce the noise bandwidth of the input to the coarse frequency estimator, an extra coarse frequency estimator, providing carrier frequency estimates to within $\pm 150$ Hz, is utilized. Operation of the extra coarse frequency stage does not require squaring of the samples. This permits reliable operation for this stage at negative values of C/N. After the extra coarse estimation stage, the received signal spectrum is processed by a narrowband filter of bandwidth 1200 Hz, centered at the estimated carrier frequency. After the filtered data is demodulated by a locally generated carrier at the estimated frequency, it is input to the currently implemented frequency acquisition stages. The filtering operation increases the C/N at the input to the second stage and hence the loss associated with the squaring operation of the second stage is less severe. The introduction of the extra coarse stage (which would precede the coarse stage 220 in FIG. 2) reduces the search range of the next stage. Hence, the computational requirements should not be worse than in the first embodiment. Further details on the algorithm now will be provided.

Figure 7:
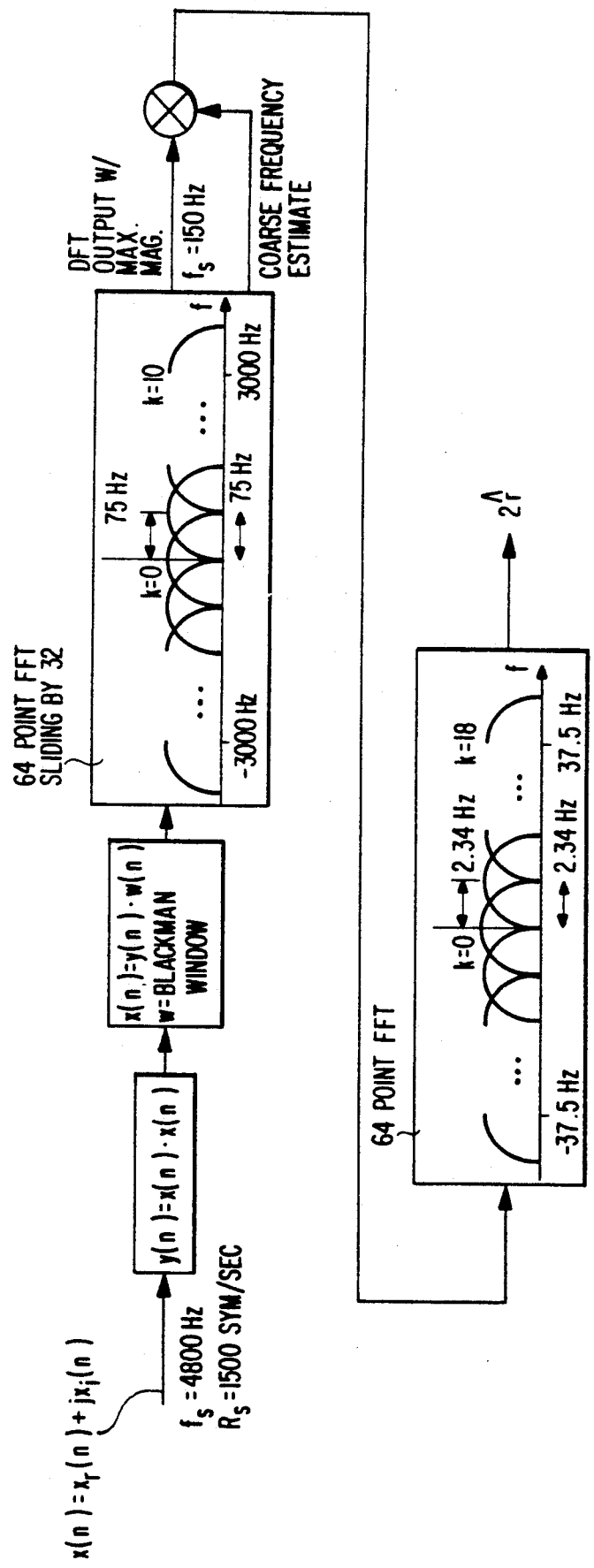
FIG. 7 is a functional block diagram of the inventive frequency acquisition algorithm implemented in Inmarsat-C Coast Earth Station (CES) signalling/message demodulators in accordance with the first embodiment.
Figure 8:
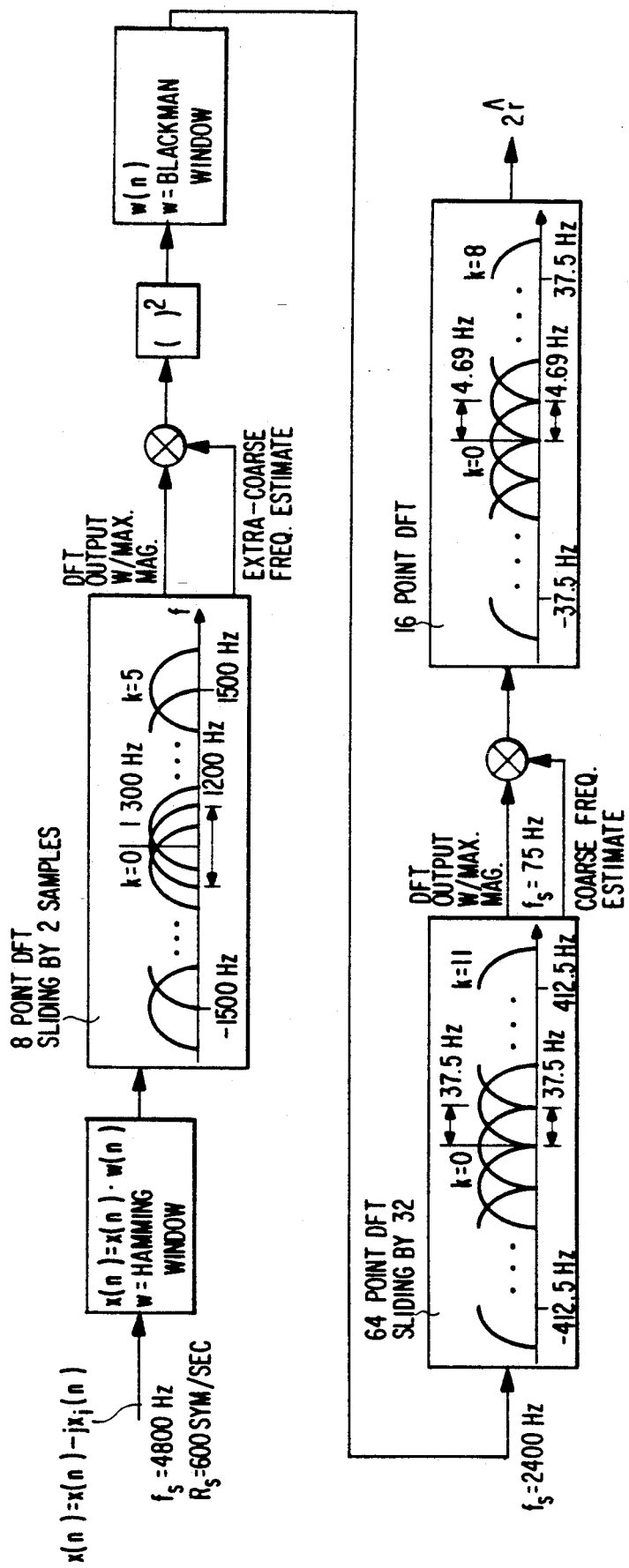
FIG. 8 is a functional block diagram of a frequency acquisition algorithm in accordance with a second embodiment of the present invention.

Block diagrams of the frequency acquisition schemes in accordance with the first and second embodiments are shown in FIGS. 7 and 8, respectively. The extra coarse frequency stage of the new algorithm consists of a series of 8-point DFTs sliding in time. At 600 bit/sec and a sampling rate of 4800 Hz, the frequency bin width is 1200 Hz. A 300 Hz frequency step size (i.e., resolution) was chosen. Since the frequency range of interest is $\pm 1500$ Hz, 11 outputs need to be calculated.

The spectrum of the N-point sequence, x(n), at point $$z_1 = e^{\frac{j2\pi f_1}{f_S}} = e^{\frac{j2\pi k}{N}}$$

on the unit circle is given by:

$$S_{z_1}(n) = x(n) + x(n-1)z_1^{-1} + \ldots + x(n-N+1)z_1^{-(N-1)}$$

which is equivalent to a finite impulse response (FIR) filtering operation. If the extra coarse frequency estimate is exact, this is also equivalent to a matched filtering operation for unfiltered BPSK transmission. The filter impulse response is given by $h(n)=z_1^{-n}$, $0 \leq n \leq N-1$.

With $z_1^{-n} = e^{j2\pi k/N}$, the frequency response of this filter is given by:

$$H(e^{j\omega}) = \sum_{n=0}^{N-1} e^{-j(2\pi kn/N)} z^{-n} \Big|_{z=e^{j\omega}}$$

which has the form $$\frac{\sin(N\omega/2)}{\sin(\omega/2 + \pi k/N)}$$

The width of the main lobe of the response is $$\omega_{width} = 2\left(\frac{2\pi f_S}{N}\right)$$

Therefore, the DFT can be represented by k FIR filters, each having the above response centered at $kf_S/N$.

The inputs to the demodulator ($f_s=4800$ Hz) are windowed by a Hamming window and then are processed by the above DFTs, with each DFT hopped by two samples. Hence, the outputs of the DFTs are equivalent to the input signal filtered by bandpass filters of total width 1200 Hz, centered at the DFT frequencies (i.e., 0 Hz, $\pm 600$ Hz, etc.) and then decimated 2:1. The hopping and decimation steps are desired so as to reduce the sampling rate and hence the computational requirements of the subsequent stages. A minimum output sampling rate of 2400 Hz is required to avoid aliasing.

If the signal is centered exactly at one of the DFT frequencies, the shape of the filter is matched to the signal spectrum. In general however, a small mismatch will occur which is of no concern since only the peak of the spectrum needs to be located, and since no further processing on this spectrum will be done. Also, introduction of a Hamming window results in improved performance over a rectangular window. The Hamming window has a wider transition region and higher sidelobe attenuation than the rectangular window. Hence, in case of a mismatch, more of the signal spectrum is preserved with a Hamming window than with a rectangular window.

The DFT output for the frequency bin corresponding to the maximum magnitude is selected as the likely signal, and then demodulated by a locally generated carrier with a frequency value corresponding to the selected bin. Hence, the frequency uncertainty is now reduced to $\pm 150$ Hz. The subsequent processing stages are similar to the ones currently used. The demodulated signal is then squared, windowed by a Blackman window, and processed through a series of 64-point DFTs. Because of the squaring operation, the frequency uncertainty is increased to ±300 Hz. The sampling rate at this stage is 2400 Hz, yielding a resolution of 37.5 Hz with a 64-point DFT. Twenty-three DFT outputs are calculated to cover the ±300 Hz uncertainty range, with additional margin. As mentioned before, if the carrier frequency does not coincide with one of the DFT frequencies of the extra coarse stage, the signal spectrum will be somewhat distorted by the DFT's "filtering" operation; however, the carrier frequency information is still present.

The DFT output of the second stage with the maximum magnitude is frequency corrected by the coarse frequency estimate, and input to the fine frequency acquisition stage which consists of a single 16-point DFT. For this stage the frequency uncertainty is ±37.5 Hz, and the sampling rate is reduced to 75 Hz. The frequency resolution for this DFT is about 4.69 Hz. Therefore, 17 outputs are calculated. After division by two, to account for the squaring operation, the resolution is improved to 2.3 Hz.

The operation of the first two stages of the algorithm were simulated at $E_s/N_o$ values of 0 and 1 dB. The results, shown below in Table 2, were obtained by processing 500 signalling channel packets with uniformly distributed frequency offsets in the range ±1500 Hz. The results show that error free frequency estimates are obtained at $E_s/N_o = 1$ dB.

TABLE 2

| Simulation Results for the New Frequency Acquisition Algorithm, Using the DFT's "Filtering" Operation | | |
|---|---|---|
| $E_s/N_o$ | Noise Seed 100128 | Noise Seed 91682 |
| 1 dB | Missed 0/500 | Missed 0/500 |
| 0 dB | Missed 10/500 | Missed 5/500 |

Figure 9:
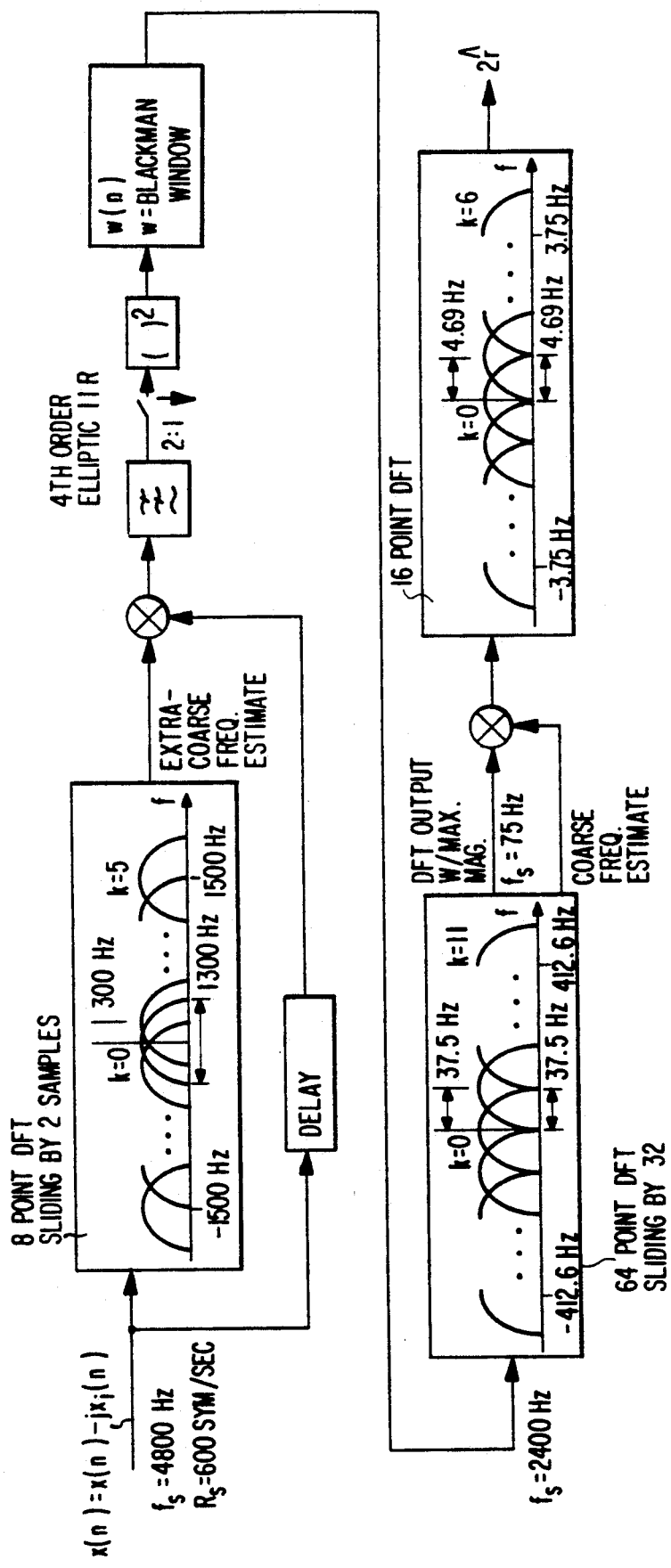
FIG. 9 is a functional block diagram of a frequency acquisition algorithm in accordance with a modification of the second embodiment of the present invention.

Since the misses at an $E_s/N_o$ of 0 dB were mostly caused by the second (i.e., the coarse) frequency acquisition stage, it seemed worthwhile to determine if this was in turn caused by the distortion of the received spectrum introduced by the first (i.e. the extra coarse) stage. Hence, the simulation program was changed such that the "filtering" operation of the first stage was replaced by an Infinite Impulse Response (IIR) filter, yielding a modification of the second embodiment of the invention. The demodulation operation then was performed on the delayed input samples instead of the DFT outputs. A block diagram of this modified second embodiment is shown in FIG. 9. The results obtained at $E_s/N_o = 0$ dB for each filter bandwidth are shown in Table 3.

TABLE 3

| Simulation Results at $E_sN_o$ of 0 dB for the New Frequency Acquisition Algorithm, Using the IIR Filters | | |
|---|---|---|
| IIR Filter Bandwidth | Noise Seed 100128 | Noise Seed 91682 |
| 0.75 kHz | Missed 29/500 | Missed 18/500 |
| 0.5 kHz | Missed 8/500 | Missed 3/500 |
| 0.3 kHz | Missed 39/500 | Missed 40/500 |

Table 3 shows that the acquisition performance degrades if the filter bandwidth is too wide (enough noise power is not rejected), or too narrow (the signal spectrum is not preserved adequately).

Thus, according to the modified second embodiment of the invention, with the IIR filter bandwidth of 0.5 kHz, the acquisition performance at an $E_s/N_o$ of 0 dB is slightly better than the second embodiment shown in FIG. 8. The trade-off between the two methods also involves the faster execution and larger storage space of the second embodiment, shown in FIG. 8, versus the slower execution and smaller storage space needed for the IIR filter method, shown in FIG. 9 (no DFT outputs need to be stored). Considering the close performance of the two techniques at an $E_s/N_o$ of 0 dB, which is significantly below the nominal operating $E_s/N_o$ of 4.7 dB, it would appear to be more desirable to employ the technique exemplified in FIG. 8, which employs no external IIR filters.

The technique of FIG. 8 also may be implemented desirably for the 1200 bit/sec mode in order to improve the acquisition performance, and minimize the software differences between the two operating modes. With the current signalling channel IF test results indicating reliable operation at an $E_s/N_o$ of 2 dB, introduction of this new scheme could improve the acquisition performance of the 1200 bit/sec mode to lower $E_s/N_o$ values.

Figure 10:
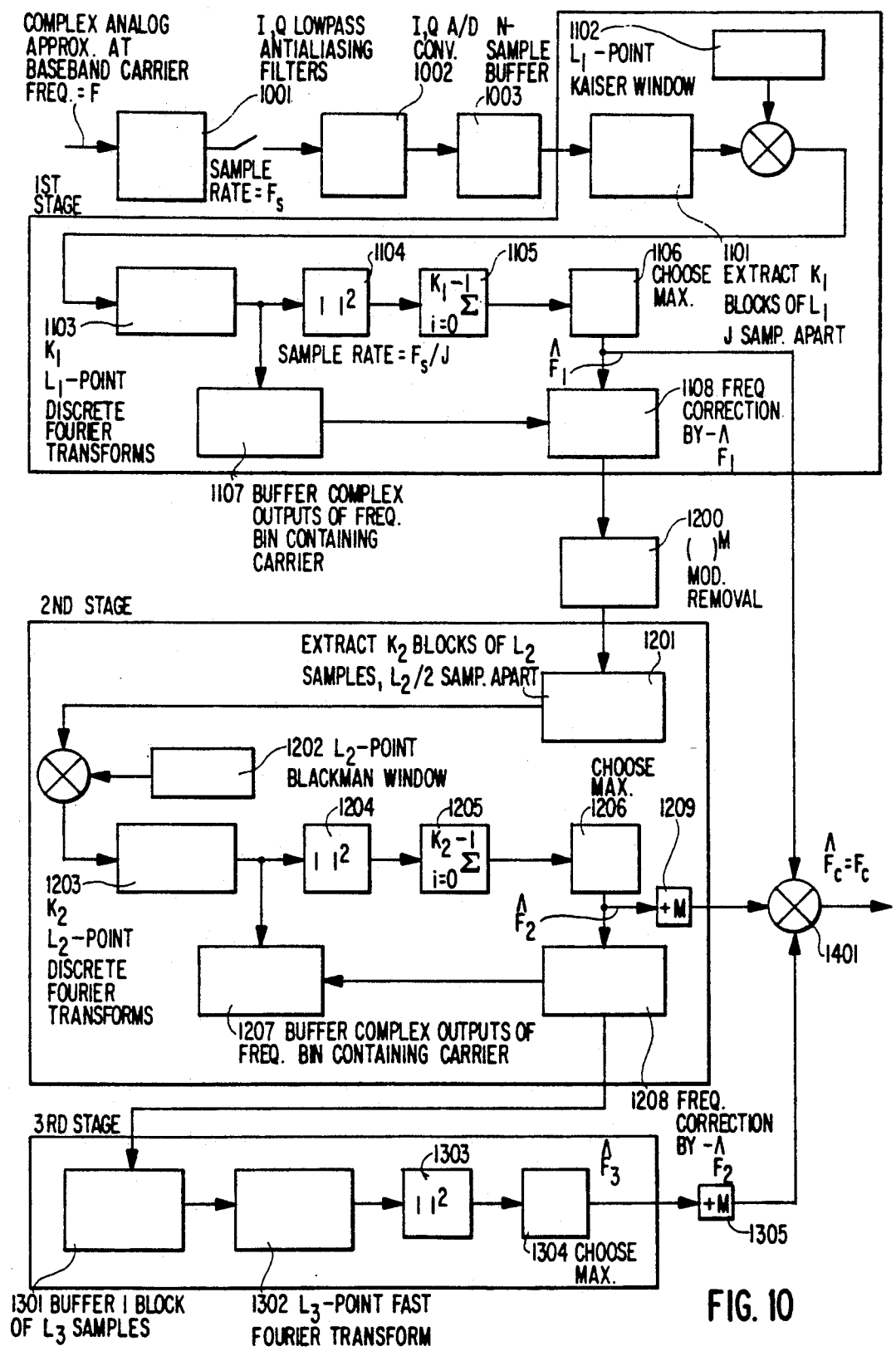
FIG. 10 is an overall block diagram of a three-stage frequency estimator in accordance with the second embodiment of the invention.

The overall structure for the three-stage frequency estimator in accordance with the second embodiment of the invention is illustrated in FIG. 10. The complex analog input is filtered by antialiasing filter 1001 and sampled by A/D converter 1002 at a sample rate of $F_S$. The estimator requires a block of N complex samples of a burst transmission stored in its input buffer 1003. Stage 1 provides a rough estimate, $\hat{F}$, of $f_c$ directly from the MPSK-modulated signal by computing a series of DFT calculations at block 1103, the DFT calculations being hopped in time. The time-hopped complex DFT outputs are bandpass filtered versions of the input signal with a two-sided bandwidth of approximately 2 $R_S$. In addition, the time-hopping process decimates the sampling rate to a lower value. Thus the DFT calculation simultaneously provides the initial carrier frequency estimate, bandpass filters the input signal, and decimates the sampling rate to approximately 2 $R_S$. The fact that these three operations are combined in this manner greatly reduces the total number of calculations required. The sample rate decimation also reduces the complexity of the following stages. For an initial uncertainty $f_c > R_s$, the bandpass filtering operation improves the signal-to-noise ratio by more than 3 dB. The filtered samples are rotated by $-\hat{F}_1$ 1108, reducing the carrier frequency to $f_c - \hat{F}_1$ before being processed in stage 2.

The MPSK modulation is then removed by raising the stage 1 output samples to the M'th power at block 1200. Thus the signal consists of a single carrier at a frequency of $M(f_c - \hat{F}_1)$. In a manner nearly identical to stage 1, stage 2 provides a higher resolution estimate, $\hat{F}_2$, of the residual frequency error and simultaneously bandpass filters the carrier signal to a much narrower bandwidth to permit simultaneous decimation to a lower sample rate. The samples are rotated by $-F_2$ in block 1208, reducing the carrier frequency to $f_c - \hat{F}_1 - \hat{F}_2$.

A high resolution frequency estimate, $F_3$, is obtained in stage 3 by doing an FFT operation on the stage 2 output samples. Finally the three estimates are summed at block 1401 to give the final, high-resolution estimate:

$$\hat{F}_c = \hat{F}_1 + \frac{1}{M} \hat{F}_2 + \frac{1}{M} \hat{F}_3 \qquad (1)$$

Details of the three frequency estimators are provided below. The example packet format of FIG. 1, described in detail above, was used for the testing.

As described above, the frequency acquisition method used in the first two stages consists of computing a series of time-hopped windowed DFTs (called "periodograms"), and averaging the energy magnitudes over the duration of a transmission burst to reduce noise and fading effects. Given a sequence of N buffered complex samples, $x(n)$, where $n=0, 1, 2, \ldots, N-1$, in block 1003, it is possible to form K subsequences $x_r(n)$, $r=1, 2, \ldots, K$, of length L spaced J samples apart.

For each of the K subsequences, the windowed DFT $X_r(k)$ is given by the following equation:

$$X_r(k) = \sum_{n=0}^{L-1} x_r(n) W(n) e^{-j(2\pi/L)nk} \quad (2)$$

where $W(n)$ is the window function
$k$ = DFT frequency bin number.

The foregoing equation is computed in block 1103 for stage 1 using Kaiser window function 1102. The calculation is performed for all values of k within the desired frequency range and repeated for all $K_1$ subsequences.

The periodogram $I_r(f_k)$ is equal to the squared magnitude of a DFT bin:

$$I_r(f_k) = |X_r(k)|^2 \quad (3)$$

where $$f_k = \frac{k}{L} = DFT \text{ frequency.}$$

The unnormalized power spectral density is then:

$$S_x(f_k) = \sum_{r=1}^{K} I_r(f_k) \quad (4)$$

In stage 1 the periodogram $I_r(f_k)$ is computed in block 1104 for all $K_1$ subsequences and for all frequency bin numbers, k, within the frequency range of interest. $S_x(f_k)$ is computed in block 1105.

The power spectral density is simply a sum of the periodograms of each subsequence and the normalized carrier frequency is given by $f_k$ for the value of k which maximizes $S_x(f_k)$. Thus the frequency estimate is obtained by searching for the maximum $S_x(f_k)$ for all values of k (block 1106 in stage 1). The step size and range of k is arbitrary and depends on the application. If the DFT is implemented as a Fast Fourier Transform (FFT), then k takes on the values $0, 1, \ldots, L-1$.

Figure 11:
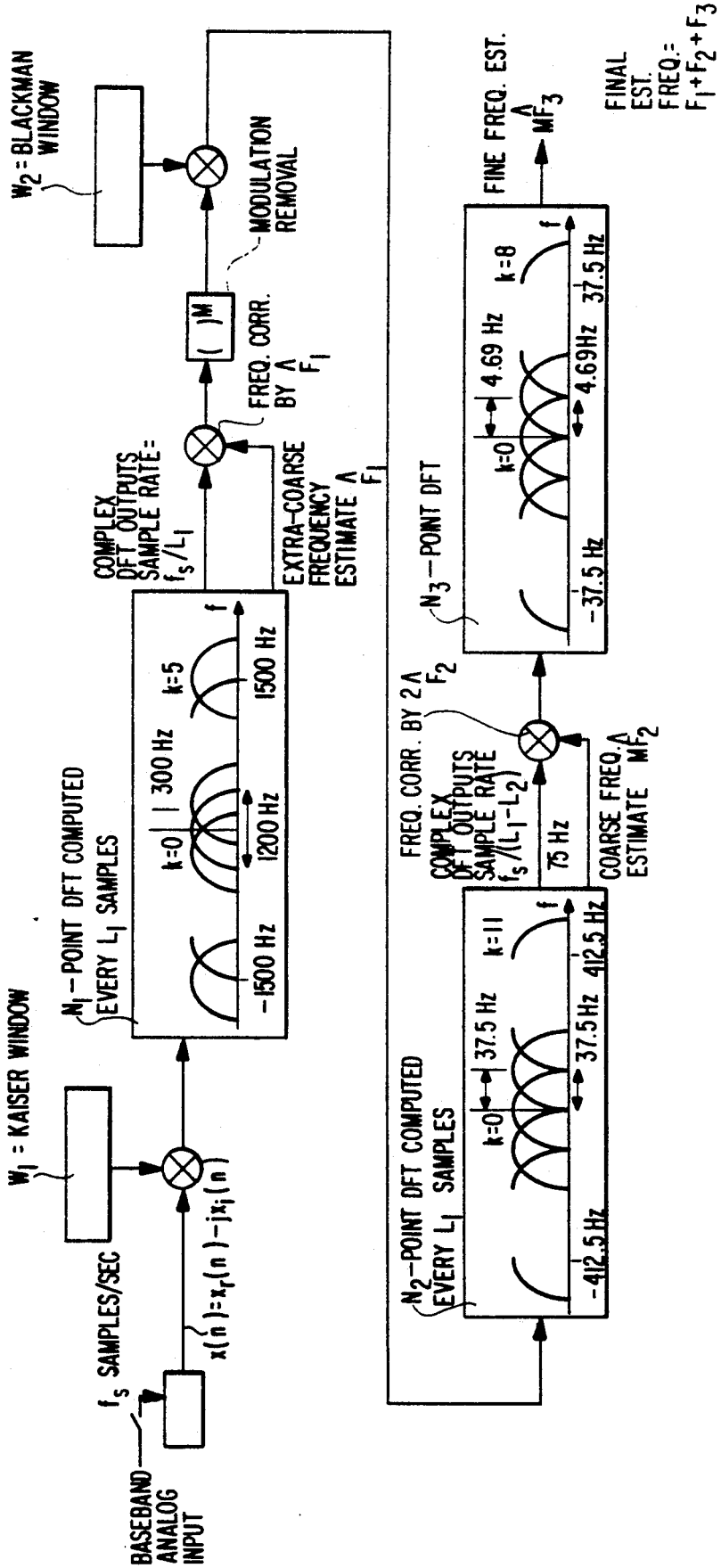
FIG. 11 is a functional block diagram of a frequency acquisition algorithm in accordance with the embodiment of FIG. 10.

For the example case, N=2048 samples (256 symbols) and $F_s=4800$ Hz (8 samples per symbol). Only the symbols in the middle of a TDMA timeslot assumed to contain the carrier are processed. The remaining symbols at the beginning and end of the timeslot are discarded due to burst location uncertainty. For $R_s=600$ bit/s, the width of the main spectral lobe is 600 Hz. For a sample rate of 4800 Hz, $L_1=8$ provides a DFT bin width that matches the main spectral lobe of the BPSK-modulated signal (FIG. 11). A Kaiser window (block 1102) with parameter $\beta=3.1$ was chosen for the window function to maximize the average signal-to-noise ratio within a DFT bin for all expected values of frequency offsets. The frequency resolution of the first estimator is 300 Hz—i.e. k has a step size of 0.5. DFT outputs are computed for all values of k within the range of $\pm 5.0$ to span the total specified frequency uncertainty range of $\pm 1500$ Hz. The first stage estimate, $\hat{F}_1$, is $k_{max} \cdot F_s/J_1$, where $k_{max}$ corresponds to the DFT bin with the maximum power spectral density and $J_1$ represents the sample rate decimation ratio of stage 1.

Each complex DFT output $X_r(k)$ can be thought of as an output at time r of a Finite Impulse Response (FIR) bandpass filter with impulse response W centered at frequency k. Thus the sequence $X_r(k_{max})$, $r=1, 2, \ldots, K_1$ is a bandpass filtered version of the input signal and the signal-to-noise ratio is greatly improved. Since each subsequence is spaced $J_1$ input samples apart, the sequence $X_r(k_{max})$ has a sample rate decimated by a factor of $J_1$ compared to the input sequence. $X_r(k_{max})$ is buffered in block 1107 for subsequent processing by stage 2.

$J_1$ must be chosen carefully to avoid aliasing effects. $F_s/J_1$ must be greater than the filtered signal bandwidth. The two-sided signal bandwidth of BPSK assuming no transmit filtering is approximately $4R_s$. Therefore $J_1 = 2$ and the decimated sample rate = 2400 Hz. The sequence $X_r(k_{max})$ stored in block 1107 is frequency corrected by $-\hat{F}_1$ to greatly reduce the frequency offset (block 1108). Frequency correction of the stored complex samples can be performed by multiplying the samples by $[\cos(2\pi \hat{F}_1 n/F_s) - J\sin(2\pi \hat{F}_1 n/F_s)]$, where n is the sample index. The sine and cosine values are obtained from a look-up table. Precautions need to be taken in minimizing the truncation error while calculating the argument $2\pi \hat{F}_1 n/F_s$.

Next, the modulation is removed in block 1200 by squaring the complex inputs (for BPSK modulation). This concentrates most of the signal energy at a single frequency equal to twice the modulated carrier frequency. Although the squaring of the signal results in a loss in the operating signal-to-noise ratio, this loss is regained in the next stage due to the averaging process performed on the DFT magnitudes.

The 1024 complex samples from stage 1 are divided into $K_2=31$ blocks of $L_2=64$ symbols spaced $J_2=L_2/2=32$ symbols apart (block 1201). A spacing of L/2 produces the most reliable estimate versus the amount of computations required. The periodograms are computed in a similar manner to stage 1 using equations 2, 3, and 4 in blocks 1203, 1204, and 1205 respectively. Each subsequence is multiplied by a 64 point Blackman window in block 1202. A Blackman window has a very broad transition width so that a carrier located at the very edge of a DFT frequency bin will be attenuated only 1.1 dB as compared to 3.9 dB for a rectangular window. At a sampling frequency of $F_s=2400$ samples/sec a 64 point DFT provides a resolution of 37.5 Hz. The resolution is increased to 18.75 Hz since the frequency estimate of the squared data is divided by two in block 1209. (In general, removing the modulation of M-ary PSK by raising the data samples to the Mth power increases the carrier frequency by a factor of M.) Because the stage 1 frequency resolution is 300 Hz, the stage 2 search can be limited to $\pm 150$ Hz. However, the search is extended to $\pm 412.5$ Hz (DFT frequency bins in the range $k=\pm 11$) to compensate for estimation error in stage 1. A DFT can be implemented more efficiently over the limited search range than the FFT implementation. The frequency bin with the highest energy, $k_{max}$, is assumed to contain the carrier and the estimate, $\hat{F}_2$, is determined (block 1206). The stage 2 sequence $X_r(k_{max})$ can also be viewed as a bandpass filtered and decimated version of the stage 2 input data and is buffered in block 1207 for further processing. The output sample rate is decimated by a factor of $L_2/2$ to 75 Hz. The 32 samples stored in block 1207 are frequency corrected by $-\hat{F}_2$ in block 1208 and then are further processed by stage 3.

The stage 2 output samples are truncated to one block of $L_3=16$ complex samples (block 1301) and a 16-point FFT calculation is performed in block 1302. The FFT is more efficient than a DFT in this case. The squared magnitude of all 16 FFT outputs (k=0, 1, ..., 15) is calculated in block 1303. The frequency bin with the maximum magnitude is selected in block 1304 and the frequency estimate $\hat{F}_3$ is determined with a resolution of 4.69 Hz. The actual resolution is 2.34 Hz since the estimate is divided by two (block 1305) to compensate for the squaring operation. For mobile satellite applications, the actual resolution is limited by short-term Doppler effects caused by motion of the mobile terminal and is on the order of 5 to 10 Hz.

The total frequency estimate then is the sum of the three individual estimates, as given in equation (1). Note that each stage attempts to correct for frequency errors in the previous stage by using an extended frequency search range.

The frequency estimator will always produce an output regardless of the presence of a carrier. The carrier is assumed to reside in the DFT frequency bin with the highest average energy. A good measure of the reliability of the estimate can be easily determined by the peak-/average energy ratio, R, from stage 1 or 2. Normally a strong spectral peak is observed in one frequency bin and low-level noise is observed in all the other bins. The peak energy is simply the average energy of the periodogram containing the maximum energy ($S_x(f_{kmax})$). The average energy is the average of all the periodograms for all other values of k. However, since significant carrier energy leakage can be observed in frequency bins adjacent to $k_{max}$, adjacent bins also should be excluded from the average. Thus:

$$R = \frac{S_x(f_{kmax})}{\underset{k \neq k_{max}, k \neq k_{max}-1, k \neq k_{max}+1}{\Sigma} S_x(f_k)}$$

This ratio is also a good means of detecting transmission burst activity. If the ratio is greater than a predetermined threshold, then a burst has been detected. This method is very reliable over a wide dynamic range, eliminating the need for gain control. Because a ratio is computed, a receiver gain factor would appear in both the numerator and denominator and therefore be cancelled out. Simulations indicate that a peak/average energy ratio threshold near 2.0 produces good results down to $E_s/N_o=2$ dB.

While the invention has been described above in detail, various changes and modifications within the scope and spirit of the invention will be apparent to those of working skill in this technological field. Thus, the invention is to be considered as limited only by the scope of the appended claims.

What is claimed is:

1. A digital preambleless demodulator comprising:
   an input buffer for receiving an input signal which includes a carrier wave and providing a baseband output;
   a coarse frequency estimator, connected to said input buffer, for providing a first estimation of a frequency of said carrier wave, said first estimation being within a first frequency band, said coarse frequency estimator comprising a first Fourier transform module for performing either a first fast Fourier transform (FFT) or a first discrete Fourier transform (DFT) to provide said first estimation; and
   a fine frequency estimator, receiving said first estimation and providing a second estimation of said frequency of said carrier wave, said second estimation being within a second frequency band that is narrower than said first frequency band, said fine frequency estimator comprising a second Fourier transform module for performing either a second FFT or a second DFT on said first estimation to provide said second estimation;
   the foregoing arrangement being such that said frequency of said carrier wave can be acquired within a predetermined resolution without necessitating a preamble in said input signal.

2. A digital preambleless demodulator as claimed in claim 1, wherein said first frequency band is $\pm 75$ Hz.

3. A digital preambleless demodulator as claimed in claim 1, wherein said second frequency band is $\pm 10$ Hz.

4. A digital preambleless demodulator as claimed in claim 1, further comprising an extra coarse frequency estimator, disposed between said coarse frequency estimator and said input buffer, for receiving said baseband output and providing a third estimation of said frequency of said carrier wave, said third estimation being within a third frequency band that is wider than said first frequency band, said extra coarse frequency estimator comprising a third Fourier transform module for performing either a third FFT or a third DFT on said baseband output to provide said third estimation, said coarse frequency estimator receiving said third estimation and providing said first estimation accordingly.

5. A digital preambleless demodulator as claimed in claim 4, wherein said third frequency band is $\pm 150$ Hz.

6. A digital preambleless demodulator as claimed in claim 5, wherein said first frequency band is $\pm 37.5$ Hz.

7. A digital preambleless demodulator as claimed in claim 5, wherein said second frequency band is $\pm 2.3$ Hz.

8. A digital preambleless demodulator comprising:
   an input buffer for receiving an input signal which includes a carrier wave and providing a baseband output;
   an extra coarse frequency estimator for receiving said baseband output and providing a first estimation of a frequency of said carrier wave, said first estimation being within a first frequency band, said extra coarse frequency estimator comprising a first Fourier transform module for receiving said baseband output and performing a first fast Fourier transform (FFT) or a first discrete Fourier transform (DFT) on said baseband output to provide said first estimation;
   a coarse frequency estimator, connected to said extra coarse frequency estimator, for providing a second estimation of a frequency of said carrier wave, said second estimation being within a second frequency band that is narrower than said first frequency band, said coarse frequency estimator comprising a second Fourier transform module for performing either a second FFT or a second DFT on said first estimation to provide said second estimation; and a fine frequency estimator, receiving said second estimation and providing a third estimation of said frequency of said carrier wave, said third estimation being within a third frequency band that is narrower than said second frequency band, said fine frequency estimator comprising a third Fourier transform module for performing either a third FFT or a third DFT on said second estimation to provide said third estimation;

the foregoing arrangement being such that said frequency of said carrier wave can be acquired within a predetermined resolution without necessitating a preamble in said input signal.

9. A digital preambleless demodulator as claimed in claim 8, wherein said first frequency band is ±150 Hz.

10. A digital preambleless demodulator as claimed in claim 8, wherein said second frequency band is ±37.5 Hz.

11. A digital preambleless demodulator as claimed in claim 8, wherein said third frequency band is ±2.3 Hz.

12. A method of performing digital preambleless demodulation of an input signal, said method comprising:

receiving an input signal which includes a carrier wave;

performing a first fast Fourier transform (FFT) or a first discrete Fourier transform (DFT) on said input signal to provide a first estimation of said frequency of said carrier wave, said first estimation being within a first frequency band; and performing a second FFT or a second DFT on said first estimation to provide a second estimation of said frequency of said carrier wave, said second estimation being within a second frequency band that is narrower than said first frequency band.

13. A method as claimed in claim 12, wherein said first frequency band is ±75 Hz.

14. A method as claimed in claim 12, wherein said second frequency band is ±10 Hz.

15. A method as claimed in claim 12, further comprising the steps of performing a third FFT or a third DFT on said input signal to provide a third estimation of said frequency of said carrier wave, said third estimation being within a third frequency band which is wider than said first frequency band, said first estimation being provided accordingly.

16. A method as claimed in claim 15, wherein said first frequency band is ±150 Hz.

17. A method as claimed in claim 15, wherein said second frequency band is ±37.5 Hz.

18. A method as claimed in claim 15, wherein said third frequency band is ±2.3 Hz.

* * * * *